(12) United States Patent
Kim et al.

(10) Patent No.: US 12,225,663 B2
(45) Date of Patent: Feb. 11, 2025

(54) ANTENNA STRUCTURE AND DISPLAY DEVICE INCLUDING THE SAME

(71) Applicant: DONGWOO FINE-CHEM CO., LTD., Jeollabuk-do (KR)

(72) Inventors: Na Yeon Kim, Seoul (KR); Dae Kyu Kim, Gyeonggi-do (KR); Han Sub Ryu, Gyeongsangbuk-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 187 days.

(21) Appl. No.: 18/131,984

(22) Filed: Apr. 7, 2023

(65) Prior Publication Data
US 2023/0328887 A1    Oct. 12, 2023

(30) Foreign Application Priority Data
Apr. 8, 2022   (KR) .................. 10-2022-0043925

(51) Int. Cl.
H05K 1/11     (2006.01)
H01Q 1/38     (2006.01)
H01Q 1/24     (2006.01)

(52) U.S. Cl.
CPC ............. H05K 1/119 (2013.01); H01Q 1/38 (2013.01); H01Q 1/243 (2013.01); H05K 2201/10098 (2013.01)

(58) Field of Classification Search
None
See application file for complete search history.

(56) References Cited

U.S. PATENT DOCUMENTS

| | | | |
|---|---|---|---|
| 2021/0210836 A1* | 7/2021 | Jang | H01Q 17/001 |
| 2022/0382076 A1* | 12/2022 | Kubota | G02C 11/10 |
| 2023/0208961 A1* | 6/2023 | Tang | H01Q 1/243 |
| | | | 361/679.01 |
| 2024/0146349 A1* | 5/2024 | Jin | H01Q 1/48 |
| 2024/0324157 A1* | 9/2024 | Liu | H05K 1/189 |
| 2024/0356227 A1* | 10/2024 | Tipul | H01Q 21/28 |

FOREIGN PATENT DOCUMENTS

| | | | |
|---|---|---|---|
| KR | 10-2006-0021421 A | | 3/2006 |
| KR | 10-2013-0095451 A | | 8/2013 |

* cited by examiner

*Primary Examiner* — Wilson Lee
(74) *Attorney, Agent, or Firm* — The PL Law Group, PLLC (57) ABSTRACT

An antenna structure according to an embodiment includes an antenna device, a circuit board connected to the antenna device and including an inner insulation layer, and an outer insulation layer formed on the antenna device to cover the antenna unit and a portion of the circuit board. A portion of the inner insulation layer covered by the outer insulation layer may have a smaller thickness than a thickness of a portion of the inner insulation layer not covered by the outer insulation layer.

15 Claims, 5 Drawing Sheets

ANTENNA STRUCTURE AND DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2022-0043925 filed on Apr. 8, 2022 in the Korean Intellectual Property Office, the entire disclosure of which is incorporated herein by reference for all purposes.

BACKGROUND

1. Field

The present invention relates to an antenna structure and a display device including the same. More specifically, the present invention relates to an antenna structure including an antenna device and a circuit board, and a display device including the antenna structure.

2. Description of the Related Art

As information technologies have been developed, wireless communication techniques such as Wi-Fi, Bluetooth, etc., is combined with an image display device in, e.g., a smartphone form. In this case, an antenna may be coupled to the display device to perform a communication function.

For example, it is necessary for an antenna for performing communication in ultra-high frequency bands to be coupled to the display device. In addition, as the display device on which the antenna is mounted becomes thinner and lighter, a space occupied by the antenna may also be reduced. Accordingly, it is not easy to simultaneously implement the transmission and reception of high frequency and wideband signals within a limited space.

However, when the driving frequency of the antenna is increased, signal loss may be increased, and as the length of the transmission path is increased, the degree of signal loss may be further increased.

Additionally, when an intermediate circuit structure such as a flexible printed circuit board (FPCB) is used to electrically connect a driving integrated circuit (IC) chip and an antenna for power supply/driving control of the antenna, additional signal loss or signal disturbance may occur.

For example, when supplying power to the antenna from the driving integrated circuit chip, unintentional radiation may occur from a wiring through which power is distributed. Thereby, noise may occur during operation and radiation efficiency of the antenna may be decreased.

Therefore, it is necessary to design an antenna which is free from an influence of the intermediate circuit structure and stably implements radiation in a desired high frequency band. For example, Korea Patent Laid-Open Publication No. 2013-0095451 discloses an antenna integrally formed with a display panel, but, as described above, does not sufficiently consider compatibility with the display device.

SUMMARY

According to an object of the present invention, there is provided an antenna structure having improved operational reliability and radiational property.

According to an object of the present invention, there is provided a display device which includes the antenna structure having improved operational reliability and radiational property.

(1) An antenna structure including: an antenna device which includes an antenna unit; a circuit board which is electrically connected to the antenna unit and includes an inner insulation layer; and an outer insulation layer formed on the antenna device to cover the antenna unit and a portion of the circuit board,
wherein a portion of the inner insulation layer covered by the outer insulation layer has a smaller thickness than a thickness of a portion of the inner insulation layer not covered by the outer insulation layer.

(2) The antenna structure according to the above 1, wherein the inner insulation layer includes an antenna bonding area which is overlapped with the antenna device in a planar direction and a circuit extension area which is not overlapped with the antenna device in the planar direction, and
the outer insulation layer covers the antenna bonding area.

(3) The antenna structure according to the above 2, wherein the antenna bonding area has a smaller thickness than a thickness of the circuit extension area.

(4) The antenna structure according to the above 2, wherein the inner insulation layer includes a core layer and a bonding sheet disposed on the core layer, and the core layer is included in the antenna bonding area and the circuit extension area, and the bonding sheet is included in the circuit extension area and is excluded in the antenna bonding area.

(5) The antenna structure according to the above 4, wherein the circuit board further includes a circuit wiring disposed on a lower surface of the core layer and electrically connected to the antenna unit.

(6) The antenna structure according to the above 5, wherein the circuit board further includes a ground layer disposed on an upper surface of the bonding sheet.

(7) The antenna structure according to the above 4, wherein the bonding sheet has a dissipation factor (Df) of 0.003 or less at 10 GHz.

(8) The antenna structure according to the above 4, wherein the bonding sheet has a greater thickness than a thickness of the core layer.

(9) The antenna structure according to the above 8, wherein the core layer has a thickness of 20 μm or less, and the bonding sheet has a thickness of 20 μm or more.

(10) The antenna structure according to the above 2, wherein the circuit board includes a bonding region adhered to the antenna device, a body region, and a bending region disposed between the bonding region and the body region, and
the antenna bonding area is included in the bonding region.

(11) The antenna structure according to the above 10, wherein the outer insulation layer has a greater thickness than a thickness of the circuit board in the bonding region.

(12) The antenna structure according to the above 10, further including an antenna driving integrated circuit chip disposed under the antenna device, and
the circuit board is bent downward to a lower side of the antenna device through the bending region, and is electrically connected to the antenna driving integrated circuit chip through the body region.

(13) The antenna structure according to the above 10, further including a conductive intermediate structure configured to bond the bonding region of the circuit board and the antenna device.

(14) The antenna structure according to the above 1, wherein the antenna unit includes: a radiator; a transmission line connected to the radiator; a signal pad connected to one end of the transmission line and electrically connected to the circuit board; and ground pads disposed around the signal pad and separated from the signal pad and the transmission line.

(15) A display device including: a display panel; and the antenna structure according to the above 1 disposed on the display panel.

The antenna structure according to exemplary embodiments may include an antenna device, a circuit board connected to the antenna device and including an inner insulation layer, and an outer insulation layer formed on the antenna device to cover a portion of the circuit board. A portion of the inner insulation layer covered by the outer insulation layer may have a thickness smaller than a thickness of a portion of the inner insulation layer not covered by the outer insulation layer. Accordingly, it is possible to prevent peeling-off of the outer insulation layer, and suppress a generation of bubbles or voids in a pressure-sensitive adhesive layer, as well as decrease losses of power supply/signal, which are transmitted through the circuit wiring.

Further, a bubble generation region may be decreased within the antenna structure. Accordingly, an area of a bezel portion or light-shielding portion of the display device to which the antenna structure is applied may be reduced, and a size of the display region may be expanded.

The inner insulation layer may include an antenna bonding area including a core layer, and a circuit extension area including the core layer and a bonding sheet. Accordingly, the circuit extension area may have a thickness greater than the thickness of the antenna bonding area by the thickness of the bonding sheet. Therefore, bonding stability between the circuit board and the antenna device may be improved, and spreading of bubbles in the outer insulation layer may be prevented.

The bonding sheet may have a dissipation factor of a predetermined value or less. Accordingly, as the inner insulation layer having a low dielectric constant is formed thickly on the circuit wiring, signal disturbance and signal loss may be suppressed, such that signal and power supply reliability may be improved.

The circuit extension area may have a thickness within a predetermined range. Accordingly, bending stability of the circuit board may be improved, and signal loss of the circuit wiring may be reduced, such that radiation reliability in a high frequency or ultra-high frequency band may be further improved.

DETAILED DESCRIPTION OF THE EMBODIMENTS

According to exemplary embodiments of the present invention, an antenna structure may include an antenna device including an antenna unit, a circuit board connected to the antenna unit, and an insulation layer which covers the antenna device and a portion of the circuit board.

According to exemplary embodiments of the present invention, a display device includes the antenna structure. The subject, to which the antenna structure is applied, is not limited to the display device, and it may be applied to various subjects or structures such as vehicles, home appliances, buildings and the like.

The antenna device may be, for example, a microstrip patch antenna manufactured in a form of a transparent film. The antenna device may be applied to, for example, a communication device for high frequency or ultra-high frequency (e.g., 3G, 4G, 5G or more) mobile communication.

Hereinafter, preferred embodiments of the present invention will be described in detail with reference to the accompanying drawings. However, since the drawings attached to the present disclosure are only given for illustrating one of several preferred embodiments of present invention to easily understand the technical spirit of the present invention with the above-described invention, it should not be construed as limited to such a description illustrated in the drawings.

The terms "first," "second," "third," "one end," "upper surface," "lower surface," "upper portion," "lower portion," and the like as used herein do not limit the absolute position or order, but are used in a relative sense to distinguish different components or portions.

Figure 1:
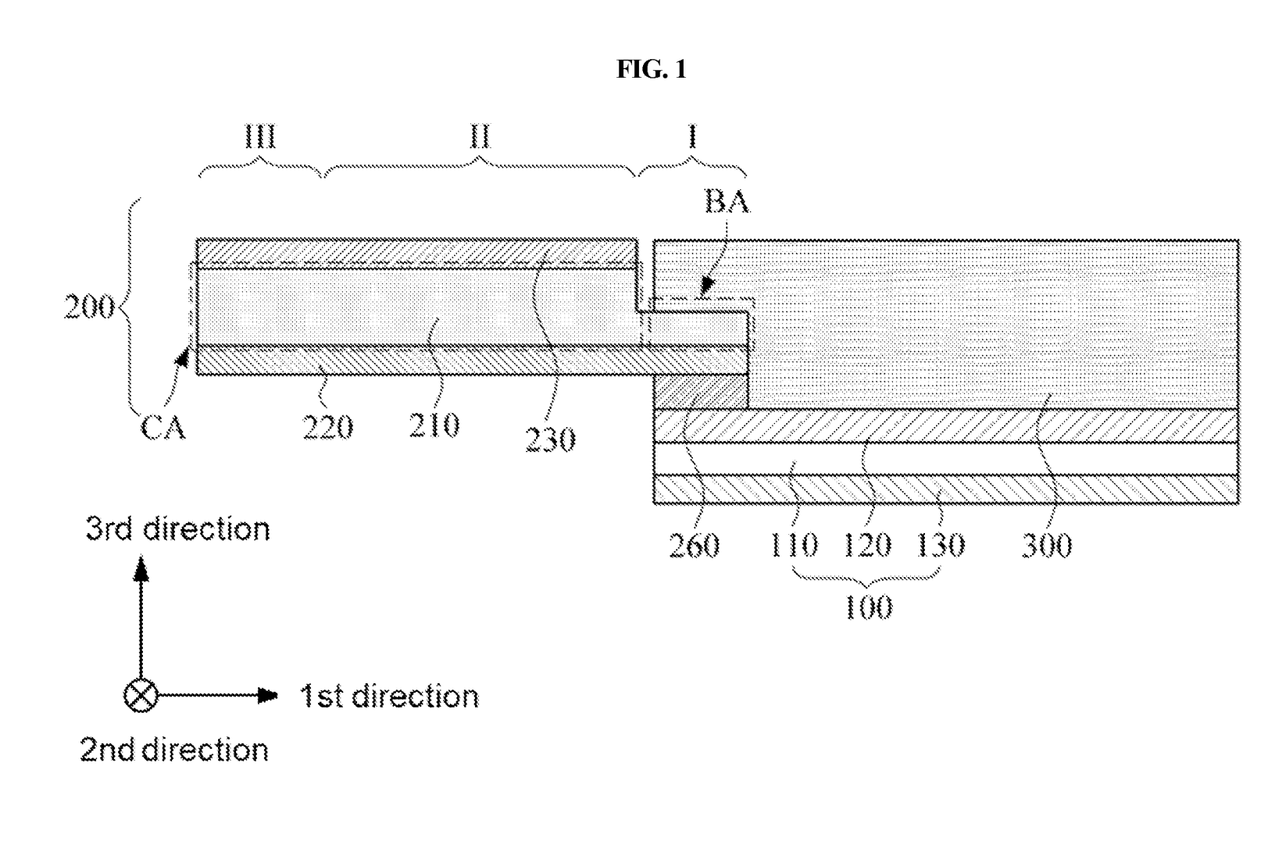
FIGS. 1 and 2 are schematic cross-sectional views respectively illustrating an antenna structure according to exemplary embodiments.
Figure 2:
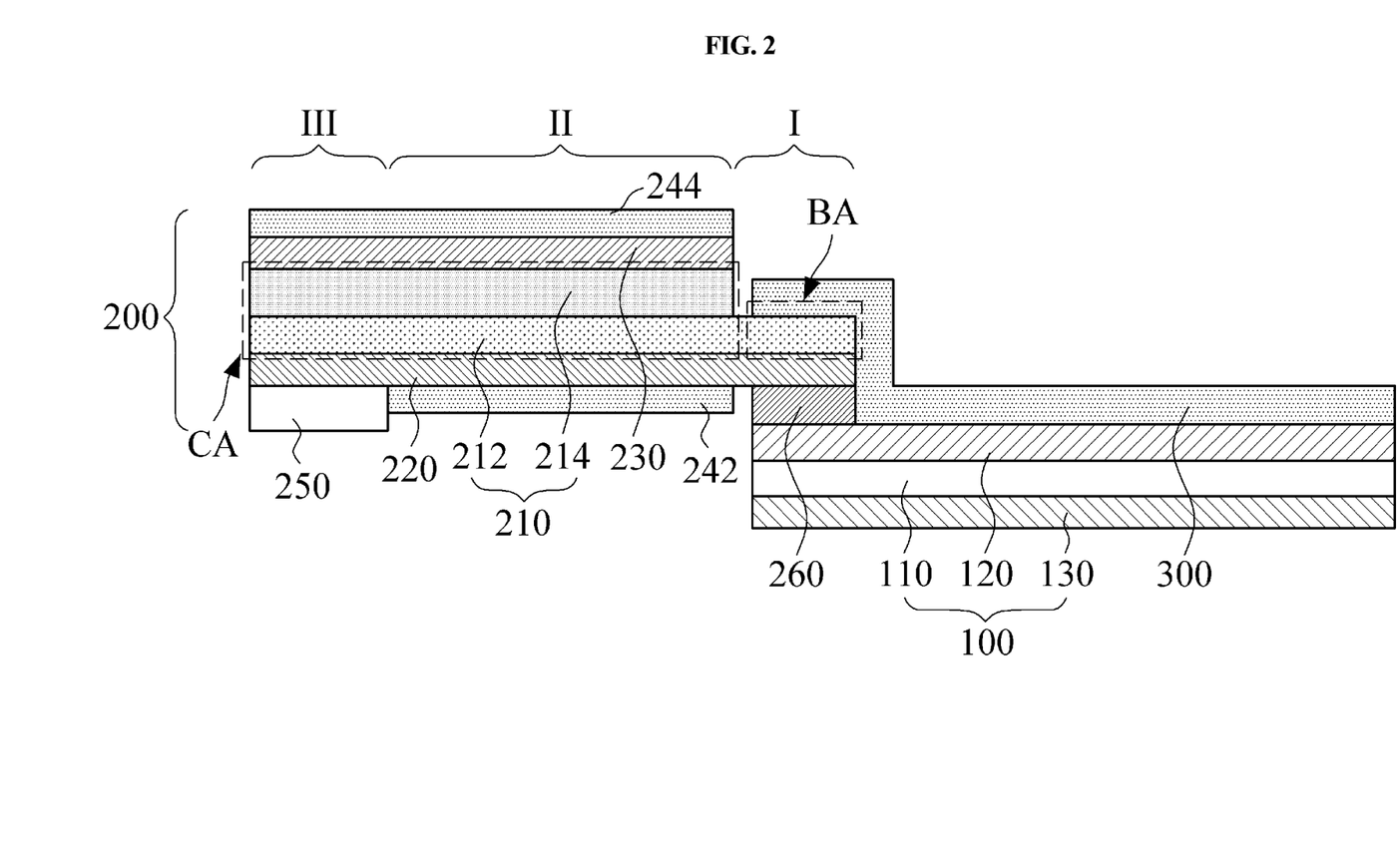

FIGS. 1 and 2 are schematic cross-sectional views illustrating an antenna structure according to exemplary embodiments, respectively.

Referring to FIG. 1, the antenna structure may include an antenna device 100, a circuit board 200 connected to the antenna device 100, and an outer insulation layer 300 formed on the antenna device 100 to cover a portion of the circuit board 200.

The antenna device 100 may include an antenna dielectric layer 110 and an antenna unit 120 disposed on an upper surface of the antenna dielectric layer 110. In one embodiment, an antenna ground layer 130 may be disposed on a lower surface of the antenna dielectric layer 110.

The antenna dielectric layer 110 may include a polyester resin such as polyethylene terephthalate, polyethylene isophthalate, polyethylene naphthalate, polybutylene terephthalate, etc.; a cellulose resin such as diacetyl cellulose, triacetyl cellulose, etc.; a polycarbonate resin; an acrylic resin such as polymethyl (meth)acrylate, polyethyl (meth)acrylate, etc.; a styrene resin such as polystyrene, acrylonitrile-styrene copolymer, etc.; a polyolefin resin such as polyethylene, polypropylene, cyclic polyolefin or polyolefin having a norbornene structure, ethylene-propylene copolymer, etc.; a vinyl chloride resin; an amide resin such as nylon, aromatic polyamide; an imide resin; a polyether sulfonic resin; a sulfonic resin; a polyether ether ketone resin; a polyphenylene sulfide resin; a vinylalcohol resin; a vinylidene chloride resin; a vinylbutyral resin; an allylate resin; a polyoxymethylene resin; an epoxy resin; a urethane or acrylic urethane resin, a silicone resin and the like. These may be used alone or in combination of two or more thereof.

The antenna dielectric layer 110 may include a pressure-sensitive adhesive material such as an optically clear adhesive (OCA), an optically clear resin (OCR) and the like. In some embodiments, the antenna dielectric layer 110 may include an inorganic insulation material such as a silicon oxide, silicon nitride, silicon oxynitride, glass and the like.

In one embodiment, the antenna dielectric layer 110 may be provided substantially in a single layer.

In one embodiment, the antenna dielectric layer 110 may also include a multi-layered structure of two or more layers. For example, the antenna dielectric layer 110 may include a base layer and a dielectric layer, and may also include a pressure-sensitive adhesive layer between the base layer and the dielectric layer.

Impedance or inductance may be formed between the antenna unit 120 and the antenna ground layer 130 by the antenna dielectric layer 110, thus to adjust a frequency band which may be driven or sensed by the antenna structure. In some embodiments, a dielectric constant of the antenna dielectric layer 110 may be adjusted to a range of about 1.5 to 12. When the dielectric constant exceeds about 12, a driving frequency is excessively reduced, such that driving of the antenna in a desired high frequency band may not be implemented.

The antenna unit 120 may include a radiator. For example, the antenna unit 120 may include a radiator and a transmission line connected to the radiator. The antenna unit 120 or the radiator may be designed to have a resonance frequency, for example, in a high frequency or ultra-high frequency band of 3G, 4G, 5G or more. For example, the resonance frequency of the antenna unit 120 may be in a range of about 20 to 70 GHz.

The antenna ground layer 130 may be disposed on the lower surface of the antenna dielectric layer 110. In some embodiments, the antenna ground layer 130 may be disposed to be entirely overlapped with the antenna unit 120 in a planar direction (e.g., a third direction).

In one embodiment, a conductive member of an image display device or a display panel, to which the antenna structure is applied, may be provided as the antenna ground layer 130.

For example, the conductive member may include electrodes or wirings such as a gate electrode, source/drain electrodes, pixel electrode, common electrode, data line, scan line, and the like, which are included in a thin film transistor (TFT) array panel.

In one embodiment, a metallic member such as a stainless steel (SUS) plate, a sensor member such as a digitizer, and a heat radiation sheet, which are disposed on a rear surface portion of the image display device, may be provided as the antenna ground layer 130.

The antenna unit 120 and the antenna ground layer 130 may include silver (Ag), gold (Au), copper (Cu), aluminum (Al), platinum (Pt), palladium (Pd), chromium (Cr), titanium (Ti), tungsten (W), niobium (Nb), tantalum (TA), vanadium (V), iron (Fe), manganese (Mn), cobalt (Co), nickel (Ni), zinc (Zn), tin (Sn) or an alloy including at least one thereof. These may be used alone or in combination of two or more thereof.

In one embodiment, the antenna unit 120 may include silver (Ag) or a silver alloy (e.g., a silver-palladium-copper (APC) alloy), or copper (Cu) or a copper alloy (e.g., a copper-calcium (CuCa) alloy) to implement a low resistance and fine line width pattern.

In some embodiments, the antenna unit 120 and the antenna ground layer 130 may include a transparent metal oxide such as indium tin oxide (ITO), indium zinc oxide (IZO), indium zinc tin oxide (IZTO), or zinc oxide (ZnOx).

In some embodiments, the antenna unit 120 may include a lamination structure of a transparent conductive oxide layer and metal layer, and for example, may have a two-layer structure of transparent conductive oxide layer-metal layer or a three-layer structure of transparent conductive oxide layer-metal layer-transparent conductive oxide layer. In this case, resistance may be reduced to improve signal transmission speed while improving flexible properties by the metal layer, and corrosion resistance and transparency may be improved by the transparent conductive oxide layer.

The antenna unit 120 may include a blackening portion. Accordingly, reflectance on the surface of the antenna unit 120 may be reduced, thereby decreasing the pattern from being viewed due to light reflection.

In one embodiment, the surface of the metal layer included in the antenna unit 120 is converted into metal oxide or metal sulfide to form a blackened layer. In one embodiment, the blackened layer such as a black material coating layer or a plating layer may be formed on the antenna unit 120 or the metal layer. Herein, the black material or plating layer may include silicon, carbon, copper, molybdenum, tin, chromium, nickel, cobalt, or oxide, sulfide, or an alloy containing at least one thereof.

A composition and thickness of the blackened layer may be adjusted in consideration of an effect of reducing reflectance.

The circuit board 200 may be disposed on the antenna device 100 and electrically connected to the antenna unit 120. In one embodiment, the circuit board 200 may be a flexible printed circuit board (FPCB).

The outer insulation layer 300 may cover the antenna device 100 and a portion of the circuit board 200. For example, the outer insulation layer 300 may physically fix the antenna device 100 and the circuit board 200, and electrical contact and bonding stability between the antenna unit 120 and the circuit board 200 may be improved by the outer insulation layer 300.

As used herein, the term "outer" is used to describe components which are not included in the circuit board 200. As used herein, the term "inner" is used to describe components which are included in the circuit board 200.

In some embodiments, the outer insulation layer 300 may include a pressure-sensitive adhesive material such as optically clear adhesive (OCA) or optically clear resin (OCR). For example, the outer insulation layer 300 may include a pressure-sensitive adhesive layer including an optically clear adhesive or optically clear resin.

Functional layers of the display device, such as an optical layer, a hard coating layer, a protective layer, a window film, window glass, and the like may be adhered or laminated to the antenna structure by the outer insulation layer 300 including the pressure-sensitive adhesive layer.

In some embodiments, the outer insulation layer 300 may cover one end portion of the circuit board 200. For example, the outer insulation layer 300 may cover a portion where the circuit board 200 and the antenna device 100 are overlapped with each other in a planar direction (e.g., a third direction).

The circuit board 200 may include an inner insulation layer 210, a circuit wiring 220 disposed on a lower surface of the inner insulation layer 210, and a ground layer 230 disposed on an upper surface of the inner insulation layer 210.

The circuit wiring 220 may be provided as an antenna power supply wiring. For example, one end of the circuit wiring 220 may be exposed to an outside, and the exposed one end of the circuit wiring 220 may be adhered to the antenna unit 120. Accordingly, the circuit wiring 220 and the antenna unit 120 may be electrically connected with each other.

A portion of the circuit board 200 may be covered by the outer insulation layer 300. The portion of the inner insulation layer 210 covered by the outer insulation layer 300 may have a smaller thickness than the thickness of a portion of the inner insulation layer 210 not covered by the outer insulation layer 300.

As the portion of the inner insulation layer 210 covered by the outer insulation layer 300 has a relatively small thickness, a thickness ratio of the outer insulation layer 300 to the circuit board 200 may be relatively increased. Accordingly, adhesion of the outer insulation layer 300 to the circuit board 200 and the antenna device 100 may be enhanced. Accordingly, peeling-off of the outer insulation layer 300 may be prevented, and a generation of bubbles in the outer insulation layer 300 may be suppressed, thereby preventing an increase in the thickness due to voids.

Additionally, as the portion of the inner insulation layer 210 not covered by the outer insulation layer 300 has a relatively large thickness, a dielectric layer having a low dielectric constant may be formed thickly inside the circuit board 200. Accordingly, power supply and signal losses of the circuit wiring 220 may be decreased.

In one embodiment, the inner insulation layer 210 includes an antenna bonding area BA which is overlapped with the antenna device 100 in the planar direction and a circuit extension area CA which is not overlapped with the antenna device 100 in the planar direction.

The outer insulation layer 300 may cover at least a portion of the antenna bonding area BA. For example, the portion of the inner insulation layer 210 covered by the outer insulation layer 300 may be included in the antenna bonding area BA. The antenna bonding area BA may have a thickness smaller than a thickness of the circuit extension area CA.

In one embodiment, the inner insulation layer 210 may have a multi-layered structure. For example, the inner insulation layer 210 may include a lamination structure including a plurality of insulation layers.

Referring to FIG. 2, the inner insulation layer 210 may include a core layer 212 and a bonding sheet 214. For example, the inner insulation layer 210 may have a multi-layered structure in which the core layer 212 and the bonding sheet 214 are sequentially laminated.

The core layer 212 may be included in the antenna bonding area BA and the circuit extension area CA of the inner insulation layer 210. The bonding sheet 214 may be included in the circuit extension area CA, but may be not included in (i.e., may be excluded from) the antenna bonding area BA.

For example, the core layer 212 may be disposed over the antenna bonding area BA and the circuit extension area CA, and the bonding sheet 214 may be disposed only in the circuit extension area CA. Accordingly, the circuit extension area CA may have a thickness greater than the thickness of the antenna bonding area BA by the thickness of the bonding sheet 214.

In this case, the circuit wiring 220 may be disposed on a lower surface of the core layer 212 and the ground layer 230 may be disposed on an upper surface of the bonding sheet 214.

In some embodiments, the ground layer 230 may be disposed to be entirely overlapped with the circuit wiring 220 included in the circuit extension area CA in the planar direction.

In one embodiment, the ground layer 230 of the circuit board 200 may face the antenna device 100. For example, the bonding sheet 214 may be disposed at the bottom of the inner insulation layer 210. In this case, the ground layer 230 may be formed on a lower surface of the bonding sheet 214 and the circuit wiring 220 may be formed on an upper surface of the core layer 212.

For example, the circuit wiring 220 may be electrically connected with the antenna unit 120 through a via structure or contact which penetrates the inner insulation layer 210.

In some embodiments, the circuit wiring 220 and the ground layer 230 may be formed of the above-described metal or alloy, and may include a transparent metal oxide. In one embodiment, the circuit wiring 220 and the ground layer 230 may include a lamination structure of a transparent conductive oxide layer and a metal layer.

The core layer 212 may include, for example, a flexible resin such as a polyimide, modified polyimide (MPI), epoxy, polyester, cyclo olefin polymer (COP), or liquid crystal polymer (LCP) resin.

For example, the bonding sheet 214 may include a flexible resin such as a polyimide, MPI, epoxy, polyester, cyclo olefin polymer (COP), or liquid crystal polymer (LCP) resin, or a pressure-sensitive adhesive material such as an optically clear adhesive (OCA) or optically clear resin (OCR), etc.

The bonding sheet 214 may have a dielectric dissipation factor value in a predetermined range. The bonding sheet 214 may have a dissipation factor (Df) (dielectric loss or loss tangent) value of 0.003 or less, which is measured at 10 GHz. For example, the bonding sheet 214 may have a dissipation factor of greater than 0 and 0.003 or less.

For example, the dissipation factor of the bonding sheet 214 at 10 GHz may be measured at room temperature (25° C.) and at a thickness of 30 μm thereof.

When the dissipation factor of the bonding sheet 214 is adjusted within the above range, dielectric characteristics of the core layer 212 due to the bonding sheet 214 may not be varied or disturbed. In addition, since the inner insulation layer 210 has a low dielectric constant or dissipation factor, signal loss may be reduced and radiation characteristics and gain characteristics of the antenna may be improved.

In some embodiments, the bonding sheet 214 may have a smaller thickness than a thickness of the core layer 212. As the thickness of the core layer 212 having a low dielectric constant is relatively increased, an entire dielectric constant of the circuit extension area CA may be decreased.

In some embodiments, the bonding sheet 214 may have a greater thickness than the thickness of the core layer 212. Accordingly, while the thickness of the antenna bonding area BA of the inner insulation layer 210 is decreased, the thickness of the circuit extension area CA may be relatively increased.

Accordingly, peeling-off of the outer insulation layer 300 due to an increase in the thickness of the antenna bonding area BA may be prevented, and a generation of bubbles may be reduced. Thus, an increase in the thickness of the antenna structure due to the voids formed inside the outer insulation layer 300 may be suppressed, and bubbles may be prevented from being viewed.

Additionally, a bubble generation region viewed to a user within the antenna structure may be reduced, and for example, a size of a bezel region of the display device, in which the antenna structure is mounted, may be minimized. Accordingly, a display region of the display device may be expanded even when an entire area thereof is decreased.

Additionally, the thickness of the circuit extension area CA is increased, such that signal loss of the circuit wiring 220 may be reduced, and signal/power supply efficiency and radiation reliability may be improved.

In one embodiment, the core layer 212 may have a thickness of 20 μm or less, preferably, 5 to 20 μm and more preferably, 8 to 12 μm.

Within the above range, the antenna bonding area BA may have a small thickness, and it is possible to prevent the bubbles from being introduced into the outer insulation layer 300 and from being diffused to an upper portion of the antenna unit 120.

In one embodiment, the bonding sheet 214 may have a thickness of 20 μm or more, and preferably, 25 μm or more. For example, the bonding sheet 214 may have a thickness of 25 to 50 μm and preferably, 25 to 38 μm.

Within the above range, the thickness of the circuit extension area CA may be increased, and signal loss and disturbance in the circuit wiring 220 may be suppressed. Accordingly, driving reliability of the antenna structure in a high frequency or ultra-high frequency region may be improved.

In some embodiments, the circuit extension area CA may have a thickness of 200 μm or less. For example, the circuit extension area CA may have a thickness of 50 to 200 μm, and preferably 50 to 100 μm.

When the thickness of the circuit extension area CA is greater than 200 μm, bending characteristics and bending stability of the circuit board 200 may be deteriorated. When the thickness of the circuit extension area CA is less than 50 μm, signal and power supply losses in the circuit wiring 220 may be increased.

In some embodiments, the antenna bonding area BA may have a length of 3 mm or less, preferably 0.5 to 3 mm, and more preferably 0.5 to 1.5 mm. Within the above range, bonding stability between the antenna device 100 and the circuit board 200 may be improved.

Figure 3:
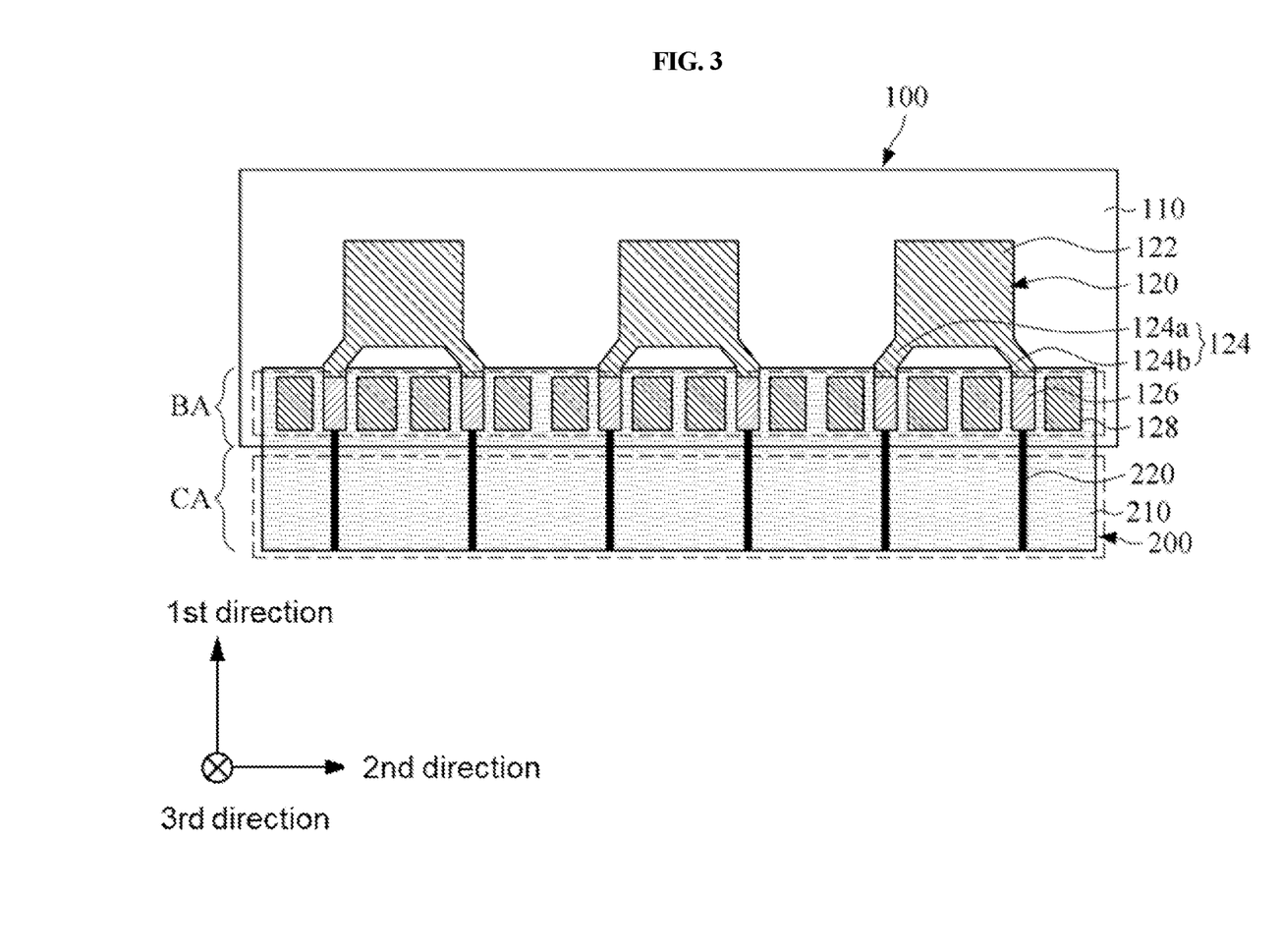
FIG. 3 is a schematic plan view illustrating the antenna structure according to exemplary embodiments.

The term "length" as used herein may refer to a distance in a transverse direction (e.g., a first direction) in FIG. 1, or a distance in a longitudinal direction (e.g., the first direction) in FIG. 3.

According to exemplary embodiments, the circuit board 200 may include a bonding region I, a bending region II, and a body region III. The bending region II may be located between the bonding region I and the body region III.

The bonding region I may be a region where the antenna unit 120 and the circuit wiring 220 of the circuit board 200 are electrically connected or adhered with each other. For example, the antenna bonding area BA of the inner insulation layer 210 may be included in the bonding region I.

Referring to FIG. 2, the outer insulation layer 300 may be conformally formed on the antenna device 100 and the circuit board 200 along a profile of the antenna structure.

For example, the outer insulation layer 300 may be formed on the antenna bonding area BA and the antenna unit 120 with a uniform thickness. In this case, the outer insulation layer 300 may have a smaller thickness than the thickness of the circuit board 200 in the bonding region I.

The thickness of the outer insulation layer 300 may be defined as a distance between the antenna unit 120 and an upper surface of the outer insulation layer 300. The thickness of the circuit board 200 in the bonding region I may be defined as a distance between the antenna unit 120 and an upper surface of the circuit board 200 in the bonding region I, and may mean a sum of the thicknesses of the core layer 212 and the circuit wiring 220, for example.

When the outer insulation layer 300 has a greater thickness than the thickness of the circuit board 200 in the bonding region I, the outer insulation layer 300 may entirely cover the antenna device 100 and the circuit board 200, such that adhesion to an upper surface of the antenna device 100 and a side surface of the circuit board 200 may be improved. Therefore, the peeling-off of the outer insulation layer 300 and the introduction of bubbles may be suppressed, and the diffusion of bubbles from the circuit board 200 to the radiator may be prevented.

In one embodiment, the thickness of the circuit board 200 in the bonding region I may be 60 μm or less, preferably 10 to 60 μm, and more preferably 10 to 30 μm. Within the above range, bonding stability may be improved, and the generation and diffusion of bubbles in the outer insulation layer 300 may be prevented.

In some embodiments, the ground layer 230 may include a mesh structure in the bending region II. For example, the ground layer 230 may have a solid structure in the body region III and may include a mesh structure in the bending region II.

Accordingly, power supply and signal transmission/reception efficiencies in the body region III may be improved, and bending stability of the circuit board 200 through bending region II may be further enhanced.

In some embodiments, a first coverlay 242 for protecting the circuit wiring 220 may be disposed on a lower surface of the circuit wiring 220. A second coverlay 244 for protecting the ground layer 230 may be disposed on an upper surface of the ground layer 230.

In one embodiment, the first coverlay 242 and the second coverlay 244 may include polyimide (PI), liquid crystal polymer (LCP) or Teflon.

In one embodiment, the first coverlay 242 and the second coverlay 244 may be formed to expose a part of each of the circuit wiring 220 and the ground layer 230 so that electronic components (e.g., antennas, resistor capacitors, inductors, IC chips, etc.) are mounted on the circuit board 200, or another circuit board, on which the electronic components are mounted, is adhered thereto. For example, the coverlay may not be formed in some regions of the circuit wiring 220 and/or the ground layer 230.

In some embodiments, the first coverlay 242 and the second coverlay 244 as a coverlay film may be not formed in the bonding region I of the circuit board 200. Accordingly, one end of the circuit wiring 220 exposed in the bonding region I may be bonded to signal pads of the antenna device 100.

In one embodiment, at least a part of each of the first coverlay 242 and the second coverlay 244 may include a flexible resin such as a polyimide resin. For example, portions of the first coverlay 242 and the second coverlay 244 corresponding to the bending region II may include printed PI ink.

Accordingly, flexibility of the circuit board 200 may be improved in the bending region II, and bonding stability of the antenna structure and bending stability of the circuit board 200 may be improved.

In one embodiment, the circuit board 200 may further include a connector 250 disposed on the lower surface of the circuit wiring 220. The antenna structure may be electrically connected with an antenna driving integrated circuit (IC) chip through the connector 250.

For example, the connector 250 may be disposed in the body region III of the circuit board 200 to be electrically connected with an intermediate circuit board on which the antenna driving IC chip is mounted.

In some embodiments, the antenna structure may further include a conductive intermediate structure 260 disposed between the antenna device 100 and the circuit board 200.

The antenna unit 120 and the circuit wiring 220 may be bonded/adhered to each other through the conductive intermediate structure 260. For example, a transmission line 124 and/or signal pads 126 of the antenna device 100 may be electrically connected with the circuit wiring 220 of the circuit board 200 through the conductive intermediate structure 260.

In the bonding region I, the antenna unit 120, the conductive intermediate structure 260, and the circuit wiring 220 may sequentially come into contact or be laminated.

In one embodiment, the conductive intermediate structure 260 may include an anisotropic conductive film (ACF).

FIG. 3 is a schematic plan view illustrating an antenna structure according to exemplary embodiments.

Referring to FIG. 3, the antenna unit 120 may include a radiator 122 and transmission lines 124 connected to the radiator 122. The radiator 122 may have, for example, a polygonal plate shape. The transmission line 124 may extend from the radiator 122 toward the bonding region I.

In one embodiment, the transmission line 124 may be integrally formed with the radiator 122 as a substantial single member.

According to exemplary embodiments, a plurality of transmission lines 124 may be connected to one radiator 122. As the plurality of transmission lines 124 are connected to one radiator 122, a plurality of polarization directions may be substantially provided.

In some embodiments, a first transmission line 124a and a second transmission line 124b may be connected to one radiator 122. For example, each of the first transmission line 124a and the second transmission line 124b may be connected to two lower vertices of the radiator 122.

The first transmission line 124a and the second transmission line 124b may be arranged symmetrically with each other. For example, each of the first transmission line 124a and the second transmission line 124b may be disposed symmetrically based on a center line passing through a center of the radiator 122.

Each of the first transmission line 124a and the second transmission line 124b may extend in different directions. For example, each of the first transmission line 124a and the second transmission line 124b may extend in different directions and may be directly connected or come into contact with the radiator 122.

In one embodiment, an angle formed by extension directions of each of the first transmission line 124a and the second transmission line 124b may be substantially 90°. For example, the extension directions of the first transmission line 124a and the second transmission line 124b may be orthogonal to each other. Preferably, the first transmission line 124a and the second transmission line 124b may extend toward the center of the radiator.

In this case, power may be supplied to the radiator 122 in two substantially orthogonal directions through each of the transmission lines 124. Thereby, dual polarization characteristics may be implemented through one radiator 122. For example, vertical radiation and horizontal radiation characteristics may be implemented together through the radiator 122.

In some embodiments, the antenna unit 120 may further include the signal pads 126 connected to the transmission lines 124. The radiator 122 and the signal pads 126 may be electrically connected to each other by the transmission lines 124.

In one embodiment, the signal pad 126 may be formed as a member substantially integral with the transmission line 124. For example, a distal end of the transmission line 124 may be provided as the signal pad 126.

The circuit wiring 220 of the circuit board 200 may be electrically connected to the signal pad 126 of the antenna device 100. For example, the circuit wiring 220 may be bonded to the signal pad 126, and power supply/driving control of the radiator 122 may be performed through the signal pad 126.

In some embodiments, the antenna device 100 may include a plurality of antenna units 120. For example, a plurality of radiation bodies 122 may be arranged to form an array.

In this case, each of the circuit wirings 220 of the circuit board 200 may be individually and independently connected with the antenna units 120. Accordingly, power supply/driving control may be independently performed for each of the plurality of radiation bodies 122. For example, different phase signals may be applied to each of the radiation bodies 122 through circuit wirings 220 connected to each of the plurality of antenna units 120.

In some embodiments, the antenna unit 120 may include a mesh structure to improve transmittance. For example, the radiator 122 and the transmission line 124 may include a mesh structure. In one embodiment, at least a portion of the transmission line 124 may include a solid structure for power supply efficiency.

In some embodiments, a dummy mesh pattern (not shown) may be formed around the radiator 122 and the transmission lines 124.

In some embodiments, ground pads 128 may be disposed around the signal pad 126 of the antenna device 100. For example, a pair of ground pads 128 may be disposed to face each other with the signal pad 126 interposed therebetween. The ground pad 128 may be electrically and physically separated from the transmission line 124 and the signal pad 126.

As the ground pads 128 are arranged around the signal pad 126, adhesion to the conductive intermediate structure 260 may be increased and bonding stability may be improved.

The signal pad 126 and the ground pad 128 may include a solid structure formed of the above-described metal or alloy in consideration of a reduction in power supply resistance, and improvement in noise absorption efficiency and horizontal radiation characteristics.

Figure 4:
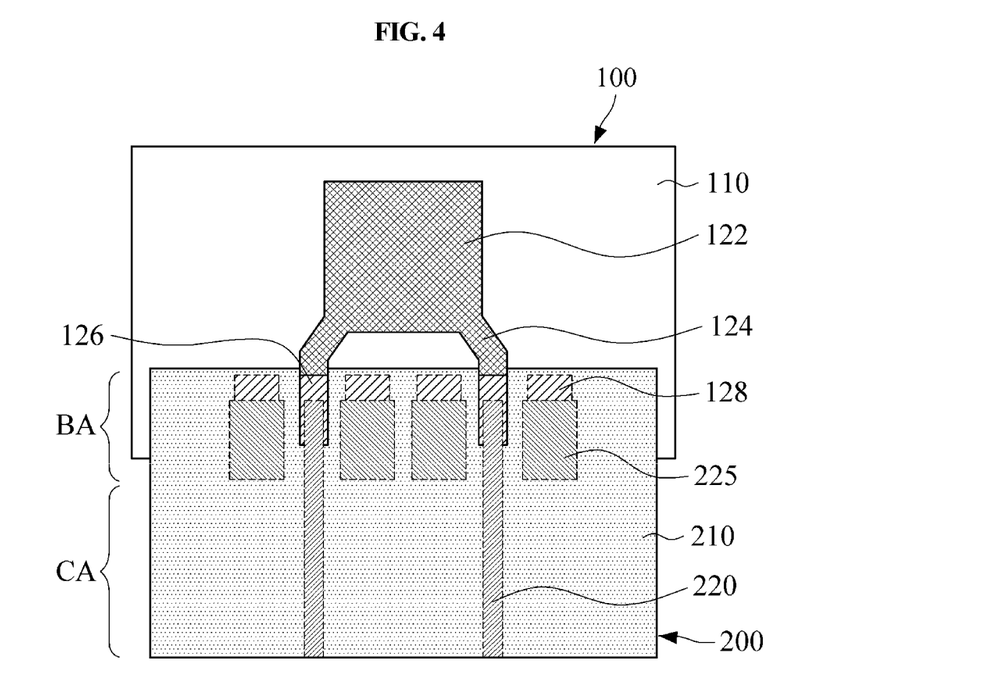
FIG. 4 is a schematic plan view illustrating the antenna structure according to exemplary embodiments.

FIG. 4 is a schematic plan view illustrating the antenna structure according to exemplary embodiments.

Referring to FIG. 4, the circuit board 200 may further include bonding pads 225 disposed around the circuit wiring 220. The bonding pads 225 may be included in the bonding region I of the circuit board 200 and may be disposed, for example, on the antenna bonding area BA of the inner insulation layer 210. For example, the bonding pads 225 may be disposed around a distal end of the circuit wiring 220.

The bonding pads 225 may be disposed on the lower surface of the core layer 212 together with the circuit wiring 220. For example, the bonding pads 225 may be disposed on the same level or the same layer as the circuit wiring 220.

In one embodiment, a pair of bonding pads 225 may be disposed with one circuit wiring 220 interposed therebetween. A pair of bonding pads 225 may be disposed to face the circuit wiring 220 with being electrically and physically separated therefrom.

The bonding pad 225 may be disposed to be overlapped with the ground pad 128 of the antenna unit 120 in the plane direction. For example, the bonding pad 225 may be adhered to the ground pad 128 included in the antenna unit 120 through the conductive intermediate structure 260.

As the bonding pad 225 is included in the bonding region I of the circuit board 200, bonding stability between the circuit board 200 and the antenna device 100 may be further improved.

The bonding pad 225 may include a solid structure formed of the above-described metal or alloy.

Figure 5:
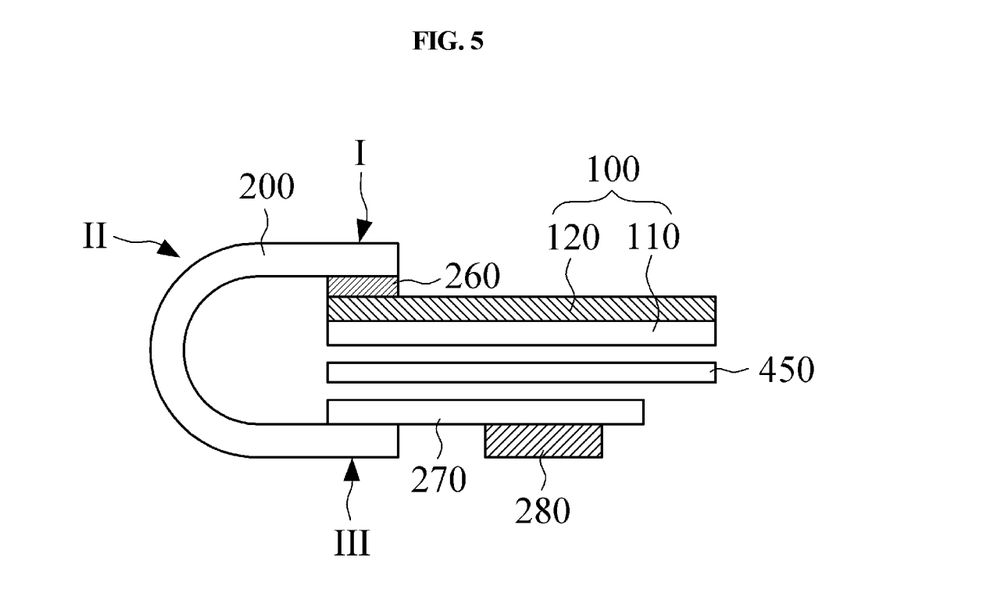
FIGS. 5 and 6 are a schematic cross-sectional view and a plan view respectively illustrating a display device according to exemplary embodiments.
Figure 6:
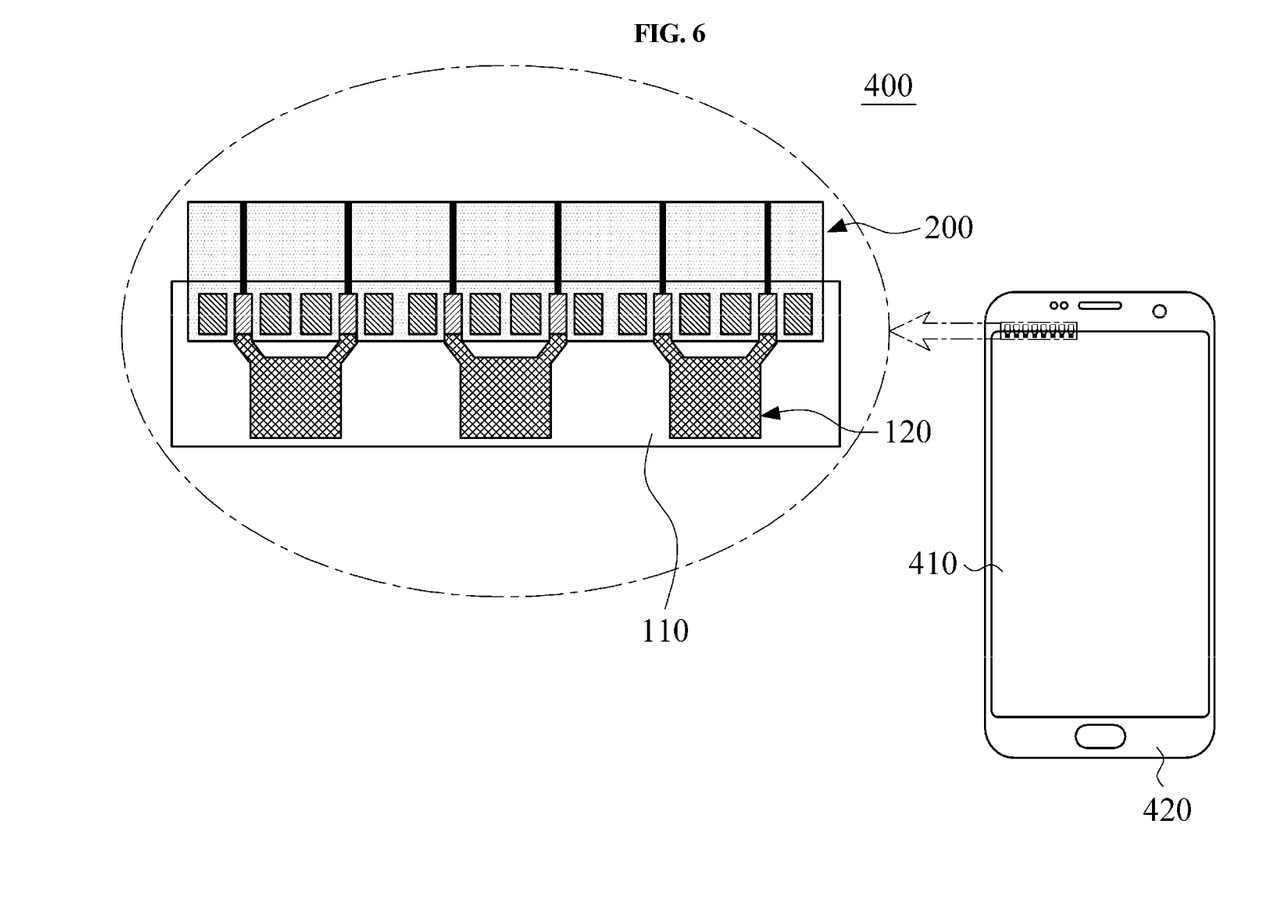

FIGS. 5 and 6 are a schematic cross-sectional view and a plan view illustrating a display device including the antenna structure according to exemplary embodiments, respectively. For the convenience of description, the detailed structure and configuration of the circuit board are not illustrated in FIGS. 5 and 6.

Referring to FIG. 5, the display device may include a display panel 450 and the antenna structure according to the above-described exemplary embodiments, which is disposed on the display panel 450.

The display panel 450 may include, for example, an OLED panel or an LCD panel, and preferably includes the OLED panel. The antenna device 100 may be disposed on the display panel 450.

The circuit board 200 may be adhered to the antenna device 100 through the bonding region I, and may be bent downward to a lower side of the display panel 450 through the bending region II. The body region III may enter a rear surface portion under the display panel 450 by the bending region II.

The circuit wiring 220 included in the body region III may be electrically connected with an antenna driving IC chip 280 through an intermediate circuit board 270. The intermediate circuit board 270 may include, for example, a main board, a package board, or a rigid printed circuit board.

The antenna driving IC chip 280 may be mounted on a lower surface of the intermediate circuit board 270 to supply power to the antenna unit 120 through the circuit board 200 and control antenna radiation.

Referring to FIG. 6, a display device 400 may be implemented in a form of, for example, a smartphone, and FIG. 6 shows the front portion or window surface of the display device 400. The front portion of the display device 400 may include a display region 410 and a peripheral region 420. The peripheral region 420 may correspond to, for example, a light-shielding portion or a bezel portion of the image display device.

The antenna device 100 included in the above-described antenna structure may be disposed on the front portion of the display device 400, and may be disposed on the display panel 450, for example. In one embodiment, the radiator 122 of the antenna unit 120 may be at least partially overlapped with the display region 410.

In this case, the radiator 122 may include a mesh structure, such that it is possible to prevent a decrease in the transmittance due to the radiator 122 and suppress the antenna unit 120 from being viewed.

The signal pads 126 of the antenna unit 120 may be disposed in a bezel region or light-shielding portion of the display device or display panel 450. The circuit board 200 may be adhered to the signal pad 126 through the bonding region I, and may be electrically connected to the antenna unit 120. The bonding region I of the circuit board 200 may be disposed in the peripheral region 420 to prevent a decrease of image quality in the display region 410.

As described above, since the portion of the inner insulation layer 210 covered by the outer insulation layer 300 (e.g., the antenna bonding area) has a smaller thickness than the thickness of the portion of the inner insulation layer 210 not covered by the outer insulation layer 300 (e.g., the circuit extension area), peeling-off of the outer insulation layer 300 and a generation of bubbles may be suppressed. Therefore, it is possible to suppress the bubbles on the display region 410 of the display device 400 from being viewed.

In addition, since the peeling-off and bubble generation of the outer insulation layer 300 are suppressed, a width of the bonding region of the circuit board 200 may be decreased.

Accordingly, the width of the bezel region or the peripheral region 420 of the display device 400 is reduced as a whole, such that the peripheral region 420 may be minimized, and a size of the display region 410 may be increased.

Hereinafter, preferred examples are proposed to facilitate understanding of the present invention. However, the following examples are only given for illustrating the present invention and those skilled in the art will obviously understand that various alterations and modifications are possible within the scope and spirit of the present invention. Such alterations and modifications are duly included in the appended claims.

Experimental Example 1: Measurement of Bubble Generation in the Outer Insulation Layer Antenna characteristics of the antenna structure of the embodiments manufactured according to the structure shown in FIGS. 1 and 3 were respectively evaluated.

The circuit wiring 220 included in the antenna bonding area BA of the circuit board 200 was formed of a copper layer, and LCP was used as the core layer 212.

Samples of the antenna structures of Examples 1 to 4 were prepared by adjusting the thickness of the circuit wiring 220 and the core layer 212 to change the thickness of the antenna bonding area BA.

The circuit board 200 is disposed so that the antenna bonding area BA is overlapped with the antenna device 100, then the outer insulation layer 300 is formed to cover the antenna bonding area BA and the antenna device 100. The outer insulation layer 300 was formed of OCA to have a thickness of 25 μm.

Thereafter, a length of bubbles formed in the outer insulation layer 300 was measured. The length of the bubbles was measured in the first direction in FIGS. 1 and 3. Measurement results are shown in Table 1 below.

TABLE 1

| Section | Thickness of antenna bonding area (μm) | Thickness of outer insulation layer (μm) | Length of generated bubbles (μm) |
|---|---|---|---|
| Example 1 | 62 | 25 | 720 |
| Example 2 | 40 | 25 | 506.6 |
| Example 3 | 23 | 25 | 328.2 |
| Example 4 | 13 | 25 | 210.6 |

Referring to Table 1, when the antenna bonding area BA has a thickness of greater than 60 μm, the peeling-off of the outer insulation layer 300 was deepened and the length of the bubbles was increased. As the thickness of the antenna bonding area BA is decreased, adhesion of the outer insulation layer 300 may be improved, and the generation and diffusion of bubbles may be suppressed.

Experimental Example 2: Measurement of Signal Loss Level (S21) Depending on the Thickness of the Inner Insulation Layer Antenna characteristics of the antenna structures of Examples 5 and 6 manufactured according to the structure shown in FIGS. 1 and 3 were respectively evaluated.

In Examples 5 and 6, the radiator 122 and the transmission line 124 were formed in a mesh structure using a Cu—Ca alloy, and the antenna ground pad 128 and the signal pad 126 were formed in a solid pattern structure including the Cu—Ca alloy.

The radiator 122 was formed in a size of 2.7 mm×2.7 mm, and the ground pad 128 was formed in a size of 2.765 mm×0.7 mm. The transmission line 124 was formed to have a length of 0.2 mm in the first direction.

The circuit wiring 220 and the ground layer 230 included in the circuit board 200 were formed of a copper layer, respectively.

In Example 5, the circuit extension area CA of the inner insulation layer 210 was formed to include the core layer 212 formed of LCP with a thickness of 50 μm and the bonding sheet 214 formed of PI with a thickness of 12.5 μm. In Example 6, the circuit extension area CA of the inner insulation layer 210 was formed of LCP with a thickness of 50 μm.

The signal loss levels S21 (see Equation 1 below) for the antenna structures of Examples 5 and 6 were measured. Specifically, the signal loss level was measured by extracting S-parameters at 28 GHz using a network analyzer. Measurement results are shown in Table 2 below.

The signal loss level S21 may be set according to Equation 1 below.

$$S21 \text{ (dB)} = 10_{10}\text{Log}\left(\frac{\text{Output power intensity}}{\text{Input power intensity}}\right) \quad \text{[Equation 1]}$$

TABLE 2

| Section | Thickness of circuit extension area (μm) | S21 (dB) |
| --- | --- | --- |
| Example 5 | 62.5 | −1.68 |
| Example 6 | 50 | −2.33 |

Referring to Table 2, the antenna structure of Example 5 has an S21 value of −2.33 dB, and the antenna structure of Example 6 has an S21 value of −1.68 dB. The antenna structures of Examples 5 and 6 exhibited a high S21 value as a whole because the circuit extension area CA had a thickness of 50 μm or more.

In addition, it was exhibited that the antenna structure of Example 5 had a higher S21 value than that of Example 6 which does not include the bonding sheet 214. Accordingly, as the circuit extension area CA further includes the bonding sheet 214 on the core layer 212, the antenna signal efficiency was improved.

What is claimed is:

1. An antenna structure comprising:
    an antenna device comprising an antenna unit;
    a circuit board electrically connected to the antenna unit, the circuit board comprising an inner insulation layer; and
    an outer insulation layer formed on the antenna device to cover the antenna unit and a portion of the circuit board,
    wherein a portion of the inner insulation layer covered by the outer insulation layer has a smaller thickness than a thickness of a portion of the inner insulation layer not covered by the outer insulation layer.

2. The antenna structure according to claim 1, wherein the inner insulation layer comprises an antenna bonding area overlapped with the antenna device in a planar direction and a circuit extension area which is not overlapped with the antenna device in the planar direction; and
    the outer insulation layer covers the antenna bonding area.

3. The antenna structure according to claim 2, wherein the antenna bonding area has a smaller thickness than a thickness of the circuit extension area.

4. The antenna structure according to claim 2, wherein the inner insulation layer comprises a core layer and a bonding sheet disposed on the core layer, and
    the core layer is included in the antenna bonding area and the circuit extension area, and the bonding sheet is included in the circuit extension area and is excluded from the antenna bonding area.

5. The antenna structure according to claim 4, wherein the circuit board further comprises a circuit wiring disposed on a lower surface of the core layer and electrically connected to the antenna unit.

6. The antenna structure according to claim 5, wherein the circuit board further comprises a ground layer disposed on an upper surface of the bonding sheet.

7. The antenna structure according to claim 4, wherein the bonding sheet has a dissipation factor (Df) of 0.003 or less at 10 GHz.

8. The antenna structure according to claim 4, wherein the bonding sheet has a greater thickness than a thickness of the core layer.

9. The antenna structure according to claim 8, wherein the core layer has a thickness of 20 μm or less, and the bonding sheet has a thickness of 20 μm or more.

10. The antenna structure according to claim 2, wherein the circuit board comprises a bonding region adhered to the antenna device, a body region, and a bending region disposed between the bonding region and the body region; and
    the antenna bonding area is included in the bonding region.

11. The antenna structure according to claim 10, wherein the outer insulation layer has a greater thickness than a thickness of the circuit board in the bonding region.

12. The antenna structure according to claim 10, further comprising an antenna driving integrated circuit chip disposed under the antenna device; and
    the circuit board is bent downward to a lower side of the antenna device through the bending region, and is electrically connected to the antenna driving integrated circuit chip through the body region.

13. The antenna structure according to claim 10, further comprising a conductive intermediate structure bonding the bonding region of the circuit board and the antenna device each other.

14. The antenna structure according to claim 1, wherein the antenna unit comprises:
    a radiator;
    a transmission line connected to the radiator;
    a signal pad connected to one end of the transmission line and electrically connected to the circuit board; and
    ground pads disposed around the signal pad and separated from the signal pad and the transmission line.

15. A display device comprising:
    a display panel; and
    the antenna structure according to claim 1 on the display panel.

* * * * *